United States Patent [19]
Oh

[11] Patent Number: 6,011,746
[45] Date of Patent: Jan. 4, 2000

[54] WORD LINE DRIVER FOR SEMICONDUCTOR MEMORIES

[75] Inventor: Jong-Hoon Oh, Fremont, Calif.

[73] Assignee: Hyundai Electronics America, Inc., San Jose, Calif.

[21] Appl. No.: 09/182,943

[22] Filed: Oct. 29, 1998

Related U.S. Application Data

[63] Continuation-in-part of application No. 08/828,817, Feb. 6, 1997, Pat. No. 5,875,149.

[51] Int. Cl.[7] .................................................. G11C 8/00
[52] U.S. Cl. .................. 365/230.06; 365/63; 365/189.11
[58] Field of Search ................................ 365/230.06, 51, 365/63, 189.09, 189.11

[56] References Cited

U.S. PATENT DOCUMENTS

| | | | |
|---|---|---|---|
| 4,747,082 | 5/1988 | Minato et al. | 365/222 |
| 4,782,465 | 11/1988 | Uchida | 365/72 |
| 4,914,630 | 4/1990 | Fujishima et al. | 365/189.04 |
| 4,967,396 | 10/1990 | Kajigaya et al. | 365/207 |
| 5,005,068 | 4/1991 | Ikeda et al. | 357/59 |
| 5,083,294 | 1/1992 | Okajima | 365/200 |
| 5,122,857 | 6/1992 | Ikeda et al. | 357/59 |
| 5,132,928 | 7/1992 | Hayashikoshi et al. | 365/63 |
| 5,172,335 | 12/1992 | Sasaki et al. | 365/63 |
| 5,193,074 | 3/1993 | Anami | 365/230.03 |
| 5,239,196 | 8/1993 | Ikeda et al. | 257/385 |
| 5,268,587 | 12/1993 | Marata et al. | 257/357 |
| 5,706,245 | 1/1998 | Kim | 365/230.06 |
| 5,708,620 | 1/1998 | Jeong | 365/230.06 |
| 5,808,955 | 9/1998 | Hwang et al. | 365/230.06 |
| 5,835,439 | 11/1998 | Suh | 365/230.06 |
| 5,862,098 | 1/1999 | Jeong | 365/230.06 |
| 5,940,343 | 8/1999 | Cha et al. | 365/230.06 |

OTHER PUBLICATIONS

M. N. Horstein, "Microelectonic Circuits and Devices," © 1990 Prentice–Hall, Inc., TK7874.H675, 729–747, 758.

*Primary Examiner*—Son Mai
*Attorney, Agent, or Firm*—Townsend and Townsend and Crew LLP

[57] ABSTRACT

A hierarchical word line driving structure uses a shared inverter circuit architecture which allows for lower power consumption and a pulsed control signal to ensure accurate memory retrieval. The shared inverter word line structure includes a row decoder, a first sub-word line driver, a second sub-word line driver, and an interconnect line. The first sub-word line driver includes an inverting circuit for inverting the signal propagating along the global word line, while the second sub-word line driver does not. The interconnect line is coupled between the first and second sub-word line drivers to communicate the inverted signal therebetween. A pulsed control signal is supplied to clamping transistors connected to unselected word lines to ensure they remain clamped to ground.

20 Claims, 12 Drawing Sheets

WORD LINE DRIVER FOR SEMICONDUCTOR MEMORIES

CROSS-REFERENCE TO RELATED APPLICATIONS

This application is a continuation-in-part of the patent application entitled "Word Line Driver For Semiconductor Memories," Ser. No. 08/828,817, filed Feb. 6, 1997, U.S. Pat. No. 5,875,149.

BACKGROUND OF THE INVENTION

The present invention relates in general to semiconductor memories, and in particular to an improved word line driving structure that reduces power consumption and chip area.

Figure 1:
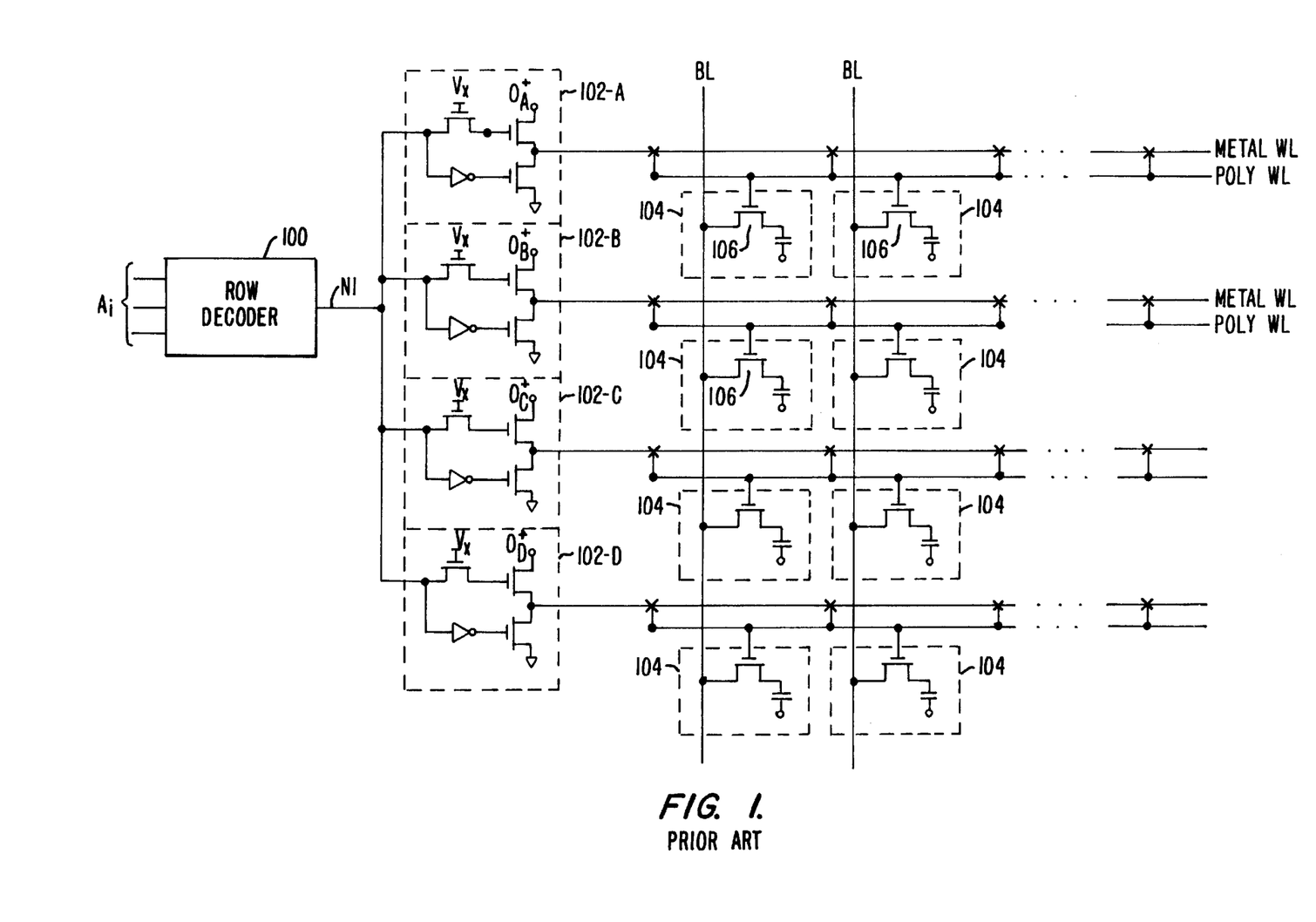
FIG. 1 shows a simplified partial schematic of the word line structure for a prior art dynamic random access memory circuit.

Semiconductor memory circuits are made up of one or more memory arrays each including memory cells located at intersections of rows (or word lines) and columns (or bit lines). A memory cell is accessed by asserting a word line and then selecting a bit line. A word line is selected by applying a row address signal to the memory device. The address signal is decoded by a row decoder whose output selects the addressed row. Using a dynamic random access memory (DRAM) circuit as an example, in each array, a single word line may drive 1024 or 2048 memory cell access transistors. FIG. 1 shows a simplified partial schematic of the word line structure for a conventional DRAM. In the typical example shown in FIG. 1, the output of a row decoder 100 drives four word line drivers 102-A, 102-B, 102-C, and 102-D. The output of each word line driver 102 connects to all of the gate terminals of the memory cell (104) access transistors 106 connected to that word line. The gate terminals of these access transistors are typically made of polysilicon, or variations on the polysilicon material (e.g., polycide). Thus, in a tvpical DRAM design, a single polysilicon line that forms the gate terminals of all memory cell access transistors common to a word line, acts as the word line.

Because of the relatively higher sheet resistance of polysilicon material, in larger arrays, metal strapping of the polysilicon word line became necessary to reduce propagation delays through the word line. A strapped polysilicon word line includes a second less resistive conductive layer, typically metal, routed over the poly layer, making contacts with the poly layer at various intervals as shown in FIG. 1. The length of the word line, silicon area consumed by the metal-to-poly contact regions, and acceptable propagation delay are among the factors that dictate the strapping intervals.

Over the years, increasingly higher density memory devices have been made possible by significant reductions in the size of the memory cell. The photolithography aspect of semiconductor processing technology, however, has met with more limited success. It has, therefore, not been possible to shrink the width and spacing of interconnect lines (e.g., metal lines) at the same rate as the size of the memory cell. As a result, at higher densities of, for example, 64 Megabits, the metal-to-metal spacing (or metal pitch) as required by the word line strapping technique has become the limiting factor in determining the size of the memory array. Thus, with the 64 Megabit generation of DRAMs, it became necessary to devise methods to overcome the word line metal pitch limitations.

One approach to relaxing the metal pitch requirement has been to use a hierarchical word line structure with a global (array long) metal word line driving segmented (shorter) polysilicon sub-word lines. In this structure, the word line decoder output (node N1 in FIG. 1) is used as the global word line (GWL) which is routed with its complement as a pair of metal lines across the entire array. Each segment or sub-word line is driven by a dedicated group of sub-word line drivers. Thus, each complementary pair of GWLs typically drives several groups of four sub-word line driver circuits distributed at various locations (segment intervals) across the array. With four sub-word lines thus sharing two metal lines, this structure improves word line density per metal pitch by a factor of two.

However, because this structure requires metal lines carrying complementary signals to be routed in parallel at minimum spacing, a metal-to-metal short would cause dissipation of excessive amounts of standby current. Several other techniques have since been proposed that minimize or eliminate this risk. These techniques typically route a single metal GWL across the array, and include additional circuitry at the local sub-word line driver regions to drive four polysilicon sub-word lines. The GWL signal usually requires a boosted level and the additional circuitry includes extra transistors as well as bus lines to be routed across the array. While these schemes have improved word line density per metal pitch by yet another factor of two (1 metal line shared by 4 poly word lines), the improvement has been realized at the cost of more complexity, appreciably higher power consumption, and larger silicon area.

There is therefore a need for an improved word line driving structure for memory circuits that takes less silicon area and dissipates less power.

SUMMARY OF THE INVENTION

The present invention provides shared inverter circuit word line structure which allows for lower power consumption and less IC layout area needed. In addition, the present invention provides a pulsed control signal. The pulse control signal is supplied to clamping transistors coupled to unselected sub-word lines, thereby ensuring that the unselected sub-word lines remain securely clamped to ground, regardless of their period of inactivity.

Accordingly, in one embodiment, the present invention provides an array of memory having a plurality of memory cells respectively located at intersections of a plurality of columns and a plurality of rows, each row being divided into a plurality of segments of sub-word lines. The memory array includes a row decoder, a first sub-word line driver, a second sub-word line driver, and an interconnect line. The row decoder has input for receiving the row address information and an output coupled to a global word line. The first sub-word line driver is located along the global word line, and has an input coupled to the global word line, an output, and an inverting circuit for inverting a signal propagating along the global word line. The second sub-word line driver is located along the global word line, and has an input coupled to the global word line and an output. The second sub-word line driver does not include an inverting circuit. The interconnect line is coupled between the first sub-word line driver and the second sub-word line driver and communicates the inverted signal therebetween.

A better understanding of the nature and advantages of the memory circuit with hierarchical word line structure according to the present invention may be had with reference to the detailed description and the drawings below.

DESCRIPTION OF THE PREFERRED EMBODIMENT

Figure 2:
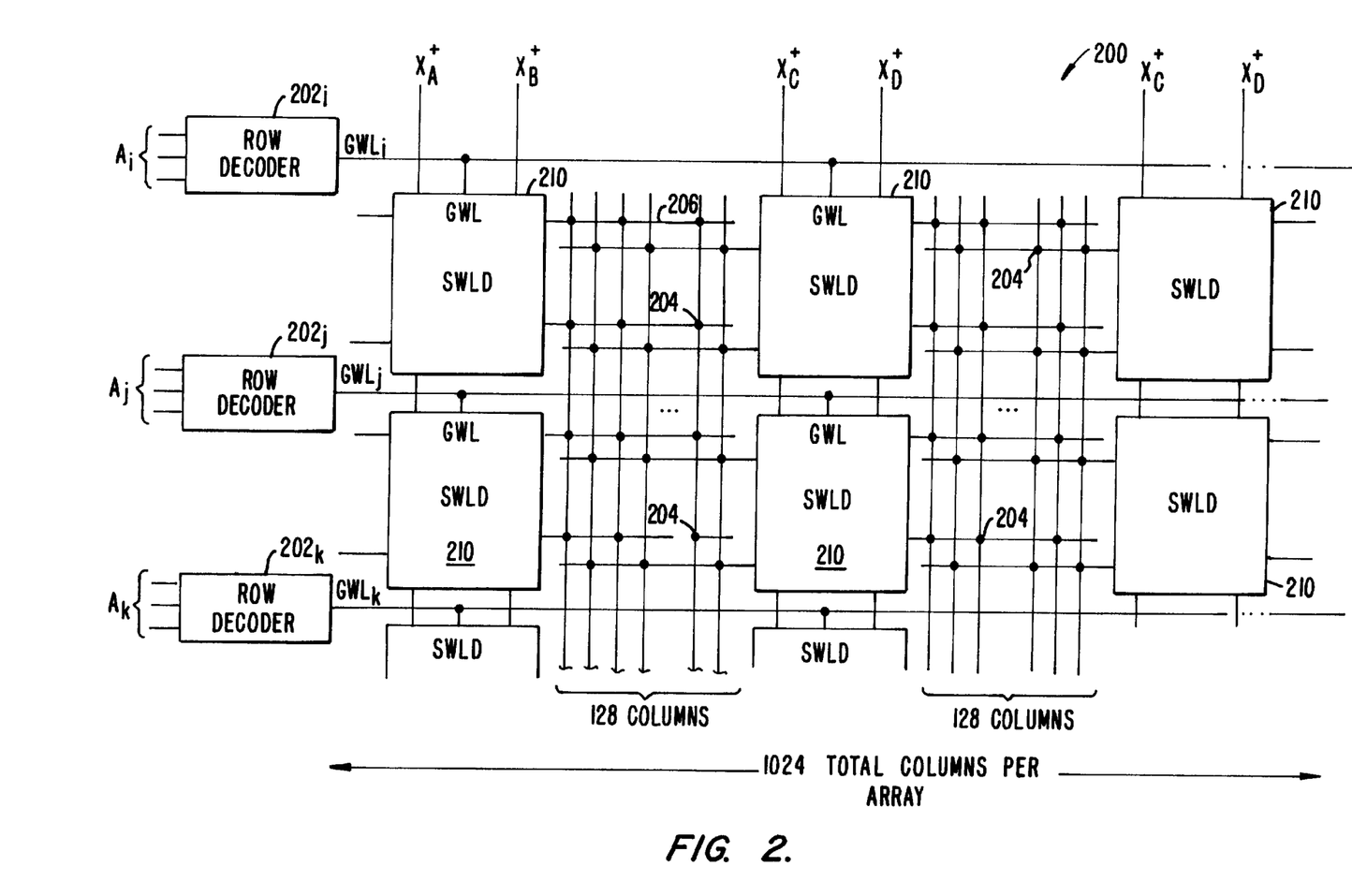
FIG. 2 is a partial schematic of the word line structure for a single array in a memory circuit according to an exemplary embodiment of the present invention.

Referring to FIG. 2, there is shown a partial schematic of an exemplary memory array 200 illustrating the hierarchical word line architecture according to an embodiment of the present invention. A row decoder $202_i$ decodes address input signals $A_i$ and generates its output on a global word line $GWL_i$. The global word line GWL traverses the entire array 200 and is made up of low resistivity conductive material such as metal. The actual polysilicon word line that connects to the gate terminals of memory cells 204, is segmented into multiple sub-word lines (SWLs) 206. For convenient depiction of the memory circuit, a memory cell 204 is represented in FIG. 2 by a small circle, but is in fact similar to memory cell 104 shown in FIG. 1. The plurality of memory cells 204 are arranged at the cross sections of sub-word lines (SWLs) 206 and bit lines or columns 208 as shown. Sub-word line driver (SWLD) circuits 210 are placed at sub-word line segment intervals. For illustrative purposes only, array 200 is for example a 256K cell array with 1024 columns 208 and 256 rows. In this exemplary embodiment, SWLD circuits 210 are located at every 128 columns. Thus, there are nine SWLD regions, with each SWLD circuit 210 driving two sub-word lines 206 on either side.

As can be seen from FIG. 2, this architecture relaxes the metal pitch requirements by accommodating four polysilicon SWLs between two metal GWLs. Further, the present invention routes a single global word line instead of a complementary pair, eliminating the risk for excessive standby currents caused by shorting interconnect lines carrying complementary signals. This is achieved by generating the complementary signal (GWL#) locally inside the SWLD circuits 210, described hereinafter in connection with FIGS. 3 through 8.

Figure 3:
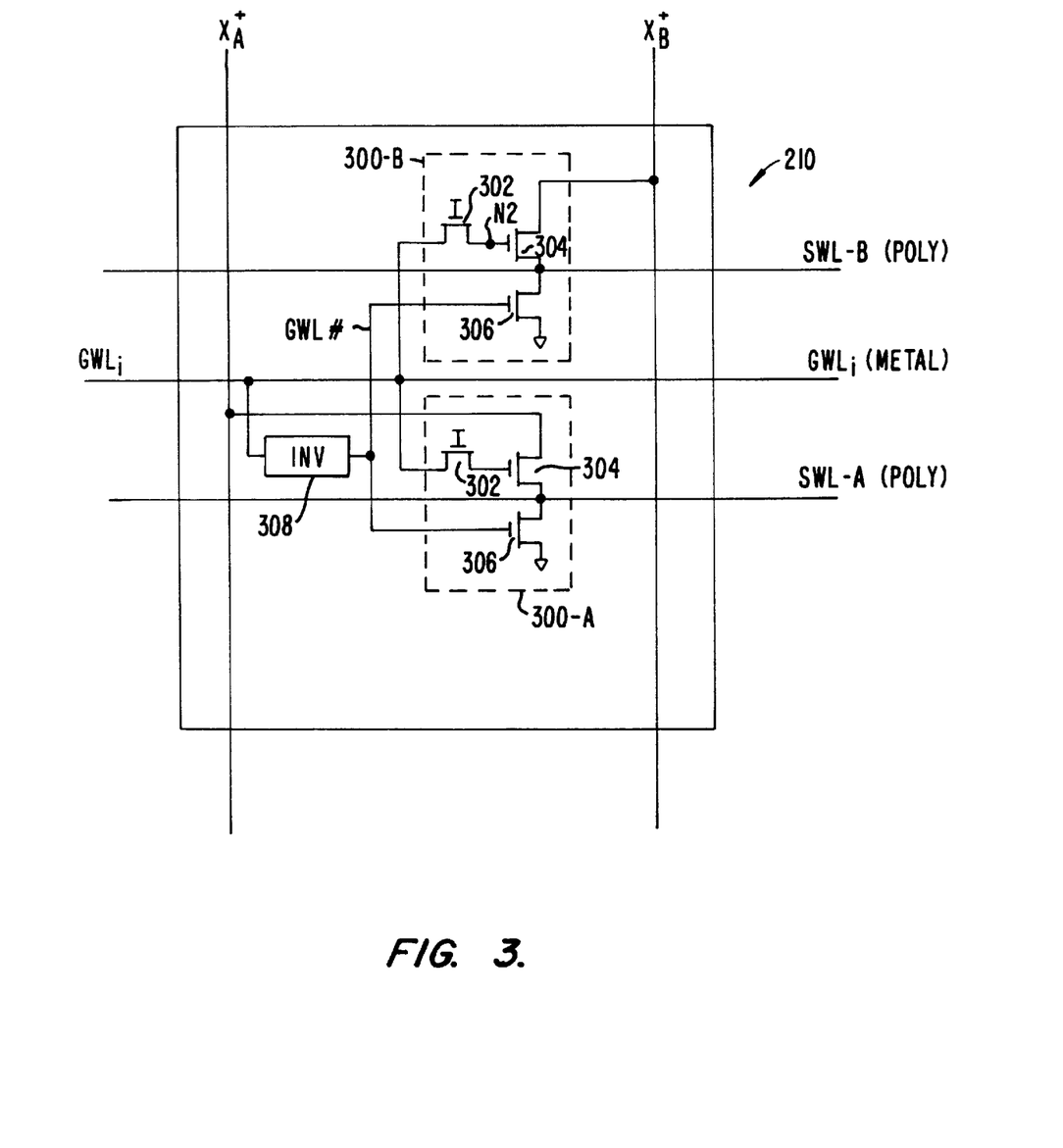
FIG. 3 is a circuit schematic of a sub-word line driver according to one embodiment of the present invention.

Referring to FIG. 3, there is shown one embodiment for a sub-word line driver (SWLD) circuit 210 according to the present invention. SWLD circuit 210 includes two internal drivers 300-A and 300-B driving sub-word lines SWL-A and SWL-B, respectively. Each internal driver includes an isolation transistor 302 that transfers the signal on GWL to the gate of bootstrap transistor 304 at node N2. The gate terminal of isolation transistor 302 may be coupled to the power supply Vcc, or alternatively to a boosted signal $V_X$. Bootstrapping of charge at node N2 occurs when the bootstrap signal $X^+_B$ moves from a low voltage to a higher voltage. A bootstrapped voltage at node N2 shuts off isolation transistor 302, isolating node N2 from the signal on GWL. Thus, when, for example, SWL-B is to be selected, transistor 304 passes $X^+_B$ to SWL-B without the loss of a threshold voltage. A third transistor 306 receives the complement of the GWL signal (i.e., GWL#) at its gate. Transistor 306 thus pulls SWL-B to ground when GWL is not selected (i.e., GWL# is high), and is otherwise turned off when GWL is selected (i.e, GWL# is low).

The circuit of the present invention eliminates the need for routing across the entire array the complement of the global word line (i.e., the GWL# line) by including a local inverter inside each sub-word line driver circuit 210. As shown in FIG. 3, an inverting circuit INV 308 receives GWL at an input, inverts the signal and supplies GWL# to gate terminals of transistors 306 in each internal driver circuit 300. Power consumption, speed and area are among the factors that govern the design of inverting circuit INV 308. The present invention offers several embodiments for inverting circuit INV 308 that appreciably improve these performance characteristics. These embodiments are described hereinafter.

Figure 4:
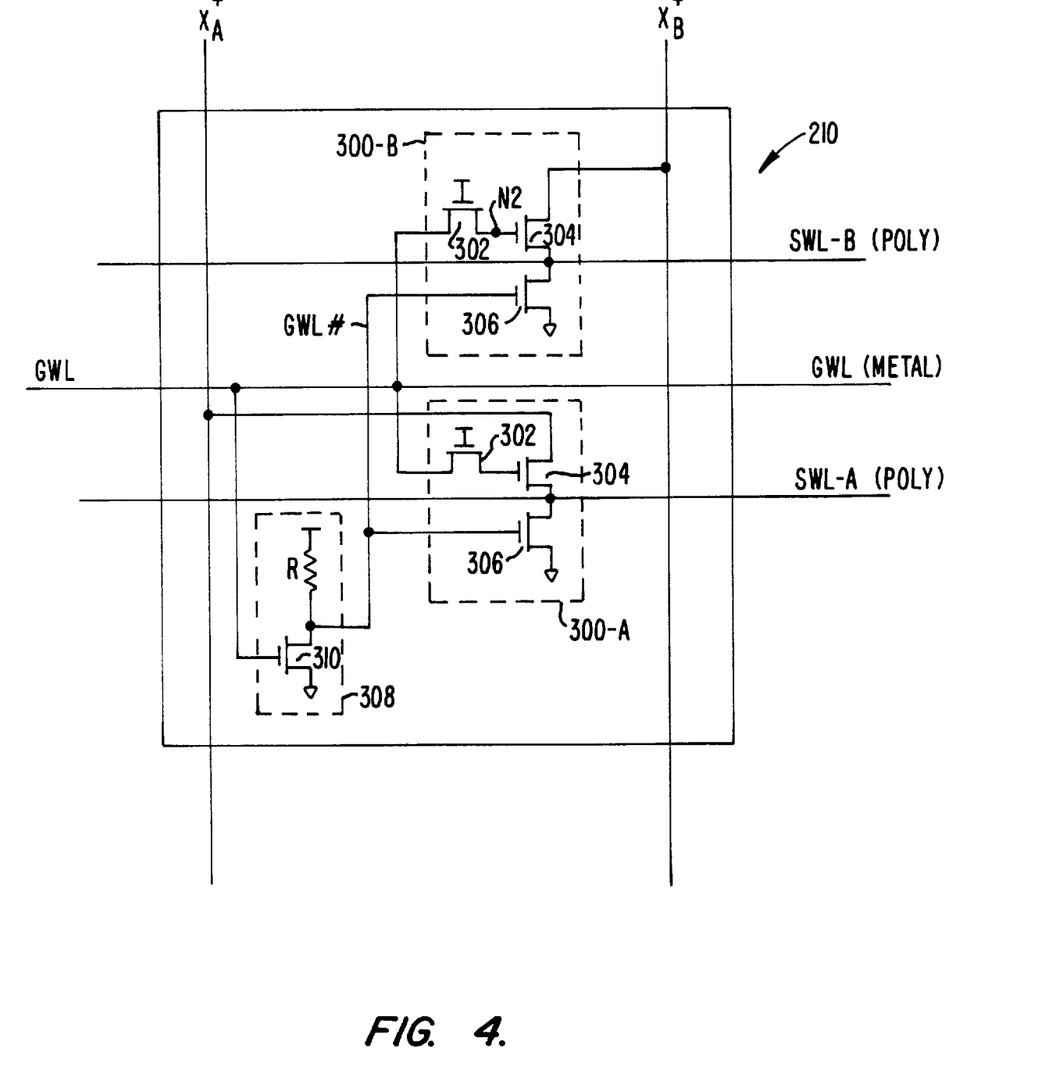
FIG. 4 shows an exemplary implementation for the sub-word line driver circuit with an NMOS inverter having a resistive load according to one embodiment of the present invention.

FIG. 4 shows a first embodiment for the sub-word line driver circuit that uses an NMOS inverter with a resistive load to implement inverting circuit INV 308. Inverting circuit 308 thus includes an NMOS pull-down transistor 310 that receives GWL at its gate, and a resistor R connected to the drain of transistor 310 which acts as the pull-up or load device. One advantage of this circuit is that it is implemented using NMOS transistors only. Not requiring PMOS transistors allows this circuit to be implemented in a relatively smaller area.

The resistance value of resistor R is determined by the trade off between power dissipation and recovery time of GWL# signal. The lower boundary for the value of R is given by the power consumption requirement when GWL# is low. For a selected GWL (i.e., GWL signal is high), GWL# signal is low. Under this condition standby current is dissipated through resistor R. Therefore, to reduce standby current, it is desirable to maximize the resistance value of R. On the other hand, the value of R should be high enough to ensure GWL# can be pulled down by transistor 310 below a threshold voltage of transistor 306, when needed. Given an on resistance of, for example, a few K ohms, for transistor 310, the value of R can thus be adjusted for proper operation.

Another factor that impacts the design of the inverter is the recovery time of the GWL# signal. An important function performed by transistor 306 in each SWL driver is to clamp the voltage on its respective SWL to ground when deselected. This reduces potential leakage current due to sub-threshold conduction when noise is coupled onto an unselected SWL by a neighboring selected SWL. To ensure that transistor 306 in a previously selected SWL driver is turned on before the next SWL is selected, places a time constraint on the recovery of the GWL# signal. That is, if in a given cycle, $GWL_i$ is selected ($GWL_i$# is low), after the completion of that cycle and before $GWL_{i+1}$ is selected (i.e., during row address strobe or RAS precharge time), $GWL_i$# should preferably return to a high voltage to turn on transistor 306 in the unselected SWL driver. The recovery time of the signal on the GWL# node is determined by the RC loading at the GWL# node. With the current state of the art, a typical RAS precharge time may be in the range of 20–30 nS. Assuming, for illustrative purposes, a RAS precharge time of 30 nS. and a total capacitance of 100 fF at the GWL# node, the maximum resistance value for R would be 300 Kohms.

Figure 5:
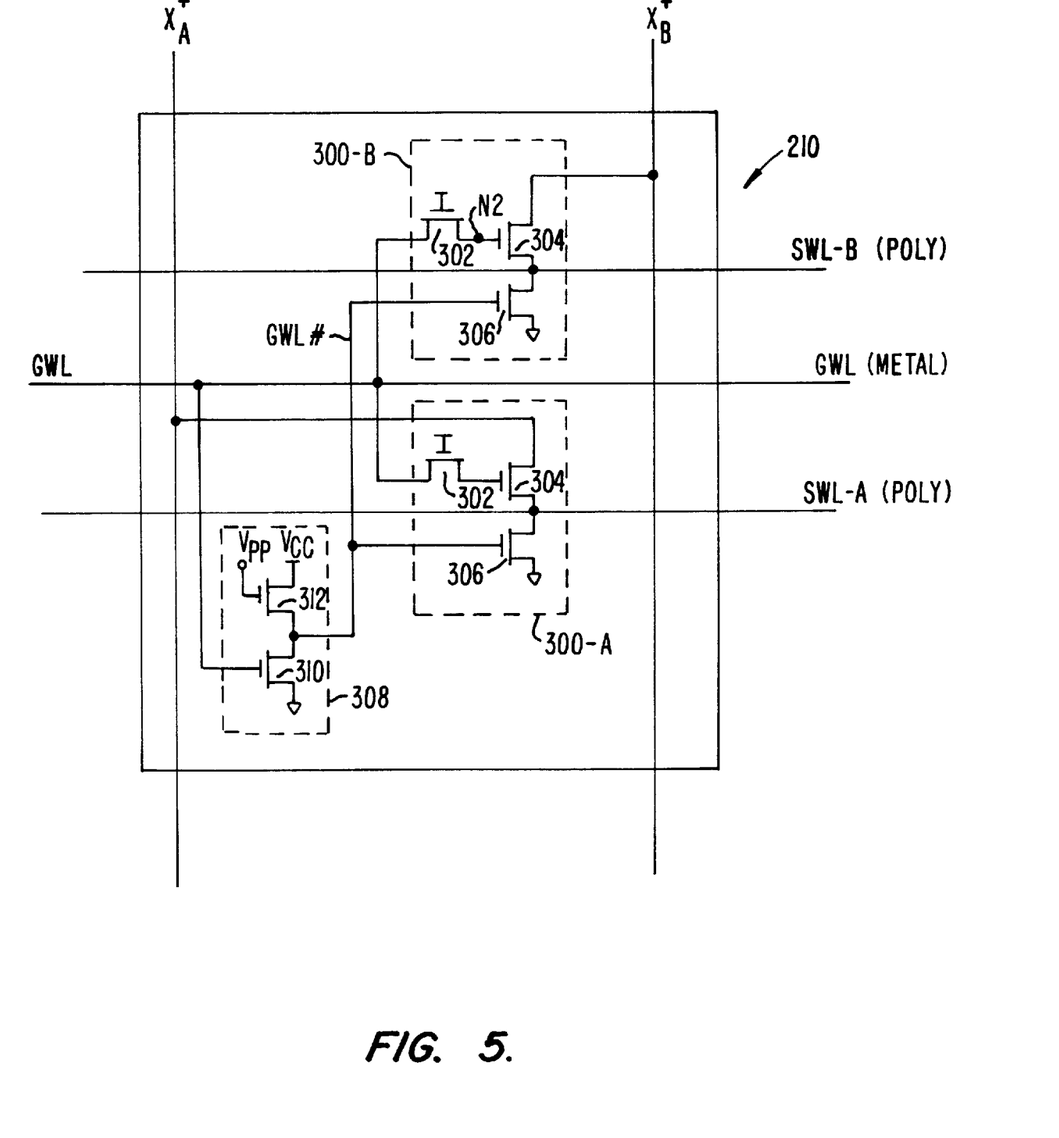
FIG. 5 shows another exemplary implementation of the sub-word line driver circuit with an NMOS inverter having an NMOS pull-up transistor according to another embodiment of the present invention.

In another embodiment, the present invention uses a transistor to implement the load device of inverting circuit INV 308. FIG. 5 shows a SWLD circuit wherein the resistor R of INV 308 is replaced by an NMOS transistor 312. In this embodiment, the gate terminal of NMOS transistor 312 connects to boosted voltage Vpp. This compensates for the threshold voltage of NMOS 312 and allows a full Vcc level to pass to GWL#. Transistor 312 can be as small as, for example, a DRAM memory cell access transistor. The effective on-resistance of NMOS transistor 312 can be adjusted by varying its size (W/L ratio). The area overhead due to INV 308 is minimal as NMOS transistors 310 and 312 are small in size, and a single INV 308 is shared by two internal sub-word line drivers 300-A and 300-B.

In the embodiment shown in FIG. 5, for a selected GWL, NMOS transistor 312 is on and drawing standby current throughout RAS active period. A variation of the embodiment shown in FIG. 5 further reduces the DC power dissipation of the SWLD circuit by switching load transistor 312. As discussed above, the clamping or hold-off function preformed by transistor 306 is aimed at reducing or eliminating the effect of cross-coupled noise from an adjacent SWL being selected. The time during which the cross-coupling of noise occurs, however, is limited to when the signal on a SWL switches state. After GWL switches state and a selected SWL also switches and reaches its final state, the signal on the SWL no longer contributes to any cross-coupling noise. Thus, it is possible to limit the clamping function to only the duration of noise coupling, instead of the entire RAS active period.

Figure 6:
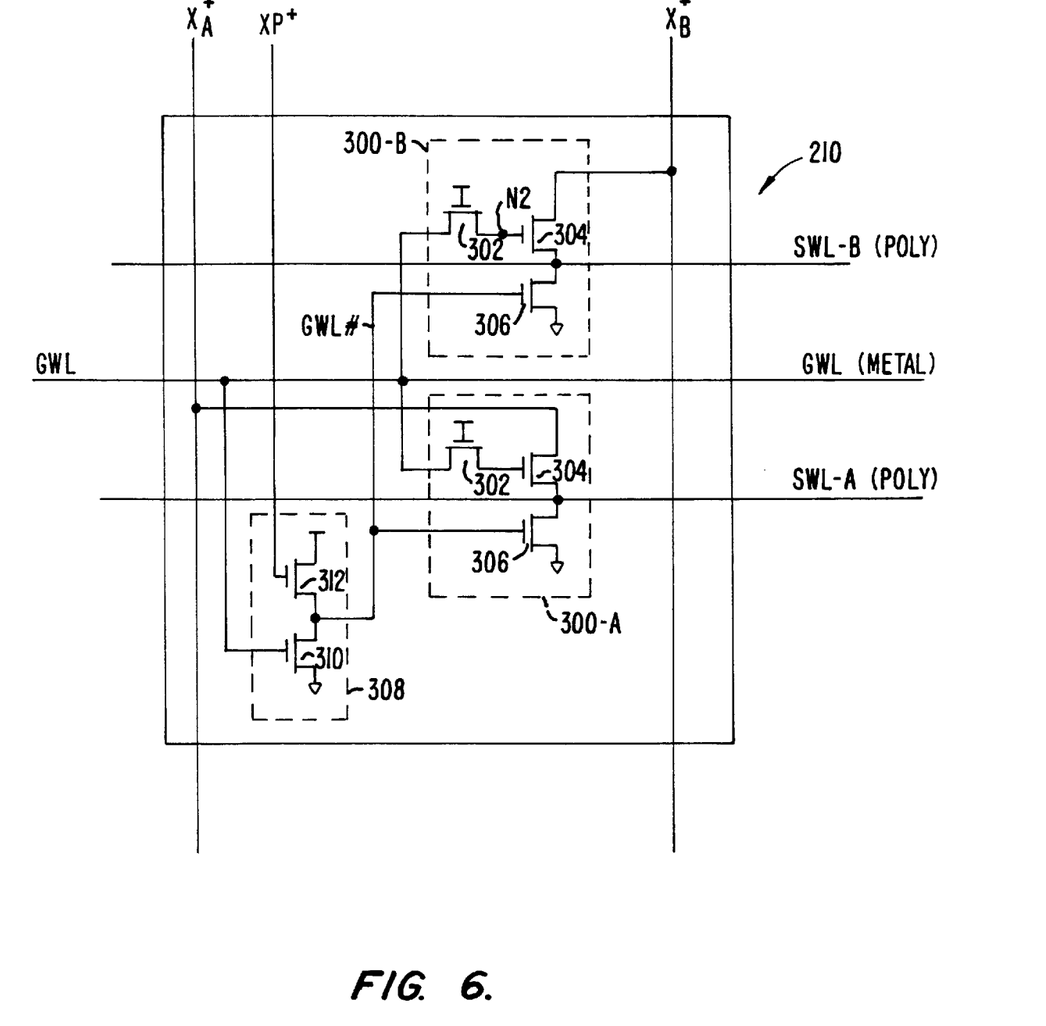
FIG. 6 shows a variation on the exemplary embodiment shown in FIG. 5 for the sub-word line driver circuit according to yet another embodiment of the present invention.
Figure 7:
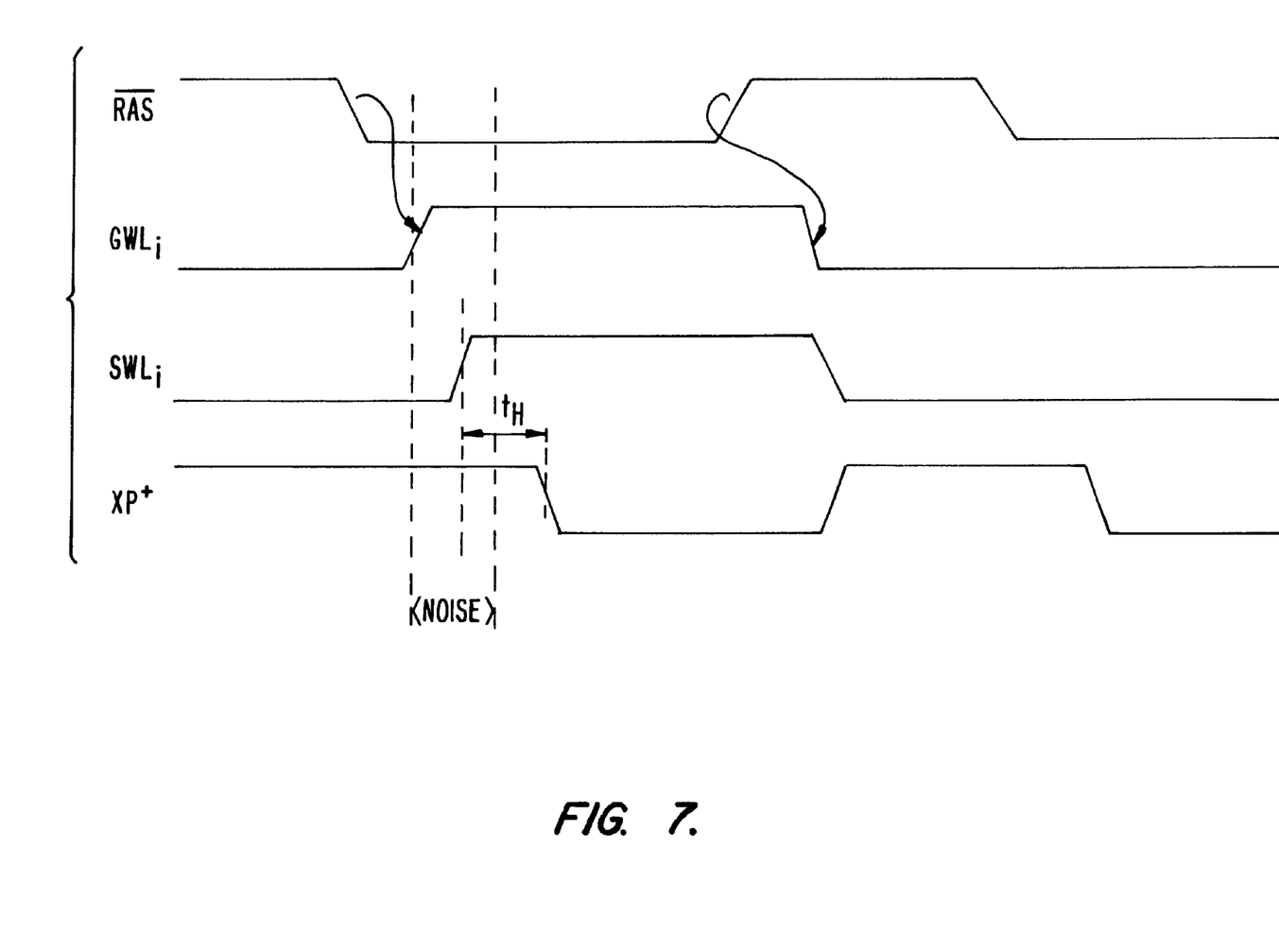
FIG. 7 is a timing diagram illustrating the operation of the exemplary embodiment of the sub-word line driver shown in FIG. 6.

In the embodiment shown in FIG. 6, the gate terminal of pull-up transistor 312 connects to an interconnect line carrying a signal $XP^+$, which has a boosted level when high. During standby mode, $XP^+$ is held at a high level to keep all GWL# signals high and SWLs clamped to ground. When a GWL is selected and its signal changes state to a high level, $XP^+$ remains initially at its high level. As pull-down transistor 310 is much stronger than the small and weaker transistor 312, in the selected SWLD, the signal on GWL# is pulled down to ground. The unselected GWLs remain low, turning their respective GWL# signals high (and transistor 306 on) for a solid clamping of the unselected SWLS. Up to this point the circuit operates much like the embodiment shown in FIG. 5, and dissipates DC current through NMOS load transistor 312. However, once the appropriate $X^+_A$ arrives and the selected SWL reaches its final high value, there is no longer a need for a clamping function. Transistor 312 can thus be turned off at this time. This is accomplished by switching the signal on $XP^+$ from a boosted high level to a low enough level to turn off transistor 312, well before the end of the RAS active period. The timing diagram illustrating the operation of the circuit of FIG. 6 is shown in FIG. 7. This embodiment of the present invention, therefore, limits DC current dissipation to a smaller window (because of reduced $t_H$), instead of during the entire RAS active period.

Figure 8:
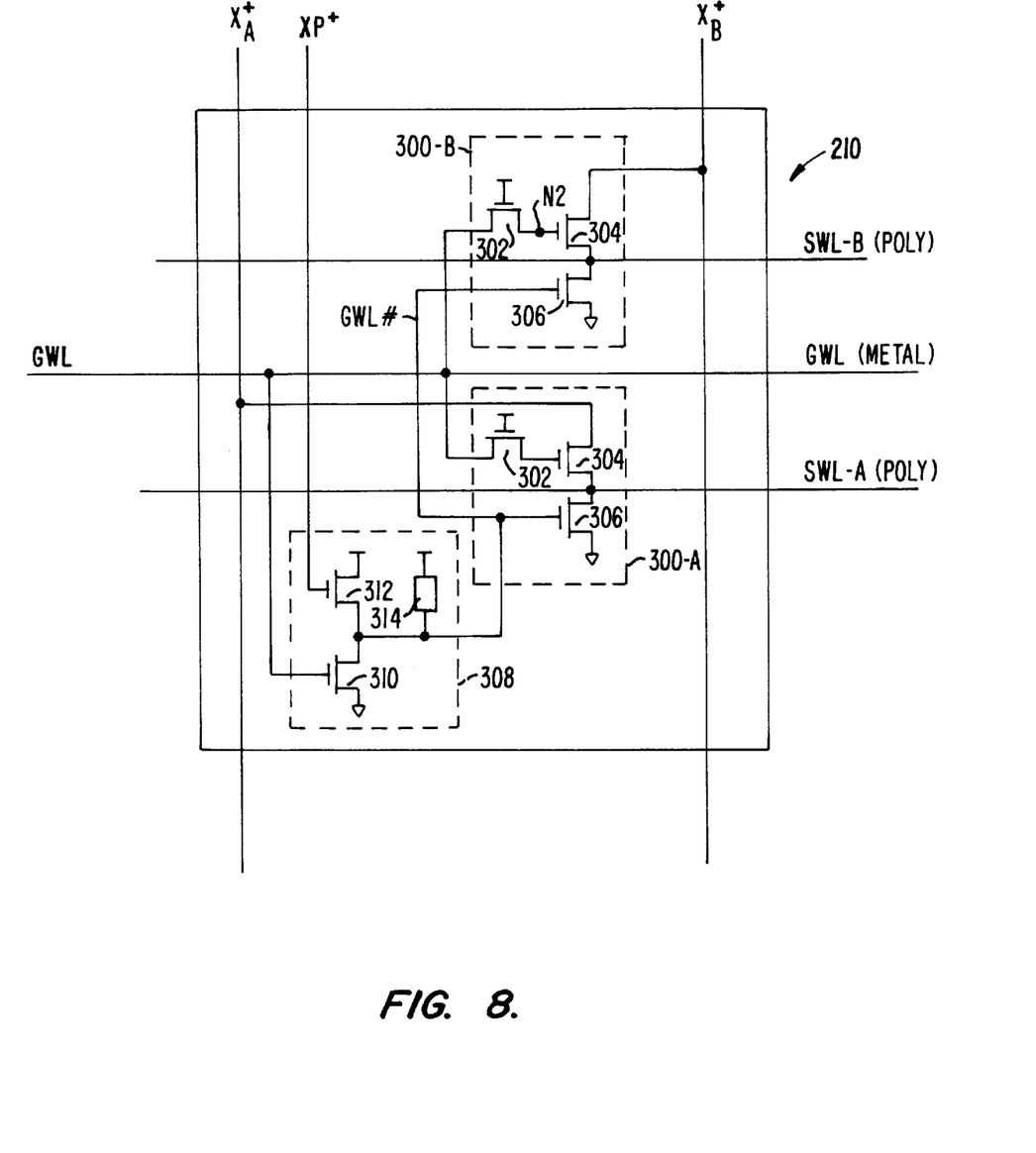
FIG. 8 is yet another exemplary embodiment of the sub-word line driver circuit of the present invention.

Yet another embodiment of the present invention implements the pull-up load device for inverter INV 308 by combining a switched load transistor with an additional resistive load device. FIG. 8 shows this embodiment of the present invention which is similar to that shown in FIG. 6, but includes an additional resistive element 314 pulling GWL# up to a high voltage. With the inclusion of a static pull-up (resistive element 314), there is no time during which GWL# is left floating. This removes the on/off timing restrictions for transistor 312 as described in connection with FIGS. 6 and 7. Thus, NMOS 312 can be turned on or off according to whether a given array is selected. More specifically, in this embodiment, the only timing requirement is that for a selected array, the signal $XP^+$ switch to a low level turning NMOS transistor 312 off, before the selected GWL switches to a high level.

Further, as discussed above, the GWL# recovery time sets the limit for the maximum value of resistance of resistive element 314. In this embodiment, however, because the recovery time is determined by pull-up NMOS transistor 312, the maximum restriction on the resistance value of resistive element 314 is removed. Thus, resistive element 314 may have as high a resistance value as the area requirements allow. A much higher resistance for the static pull-up reduces standby current significantly as compared to the embodiments shown in FIGS. 4 and 5. Resistive element 314 may be implemented using a resistor or preferably a very small transistor (e.g., the size of a DRAM cell access transistor) that exhibits on-resistances as high as or greater than, for example, one Megaohm.

The embodiment shown in FIG. 8, thus improves the current consumption as compared to the embodiments in FIGS. 4 and 5, and is also an improvement on the embodiment shown in FIG. 6 with respect to certain circuit layout considerations. Specifically, for the embodiment shown in FIG. 6, every array requires an extra interconnect line carrying the $XP^+$ signal which is routed through the bit line sense amplifier region. Since $XP^+$ has its own timing requirements in the embodiment of FIG. 6, a separate interconnect line in each array is dedicated for this signal. As discussed above, the embodiment shown in FIG. 8 simplifies the timing requirement for the $XP^+$ signal such that $XP^+$ is switched low for a selected array before GWL switches high. In conventional DRAM circuitry, the signal that precharges bit lines has the exact same timing characteristics. Thus, in this embodiment, no new interconnect line and timing circuitry need be added which saves area.

FIG. 2 illustrates a word line structure in which each SWLD includes one inverting circuit for locally generating and supplying the GWL# signal. In an alternative embodiment, however, one inverting circuit may be used to supply two or more SWLDs. A shared inverting circuit architecture has advantages in that fewer implemented inverting circuits will consume less power. In addition, since fewer inverting circuits are used, the total circuit area required is also reduced. The reduction becomes even more pronounced in word line structure embodiments using the aforementioned resistively-loaded inverting circuits since the resistor element employed therein typically occupies a large layout area.

Figure 9:
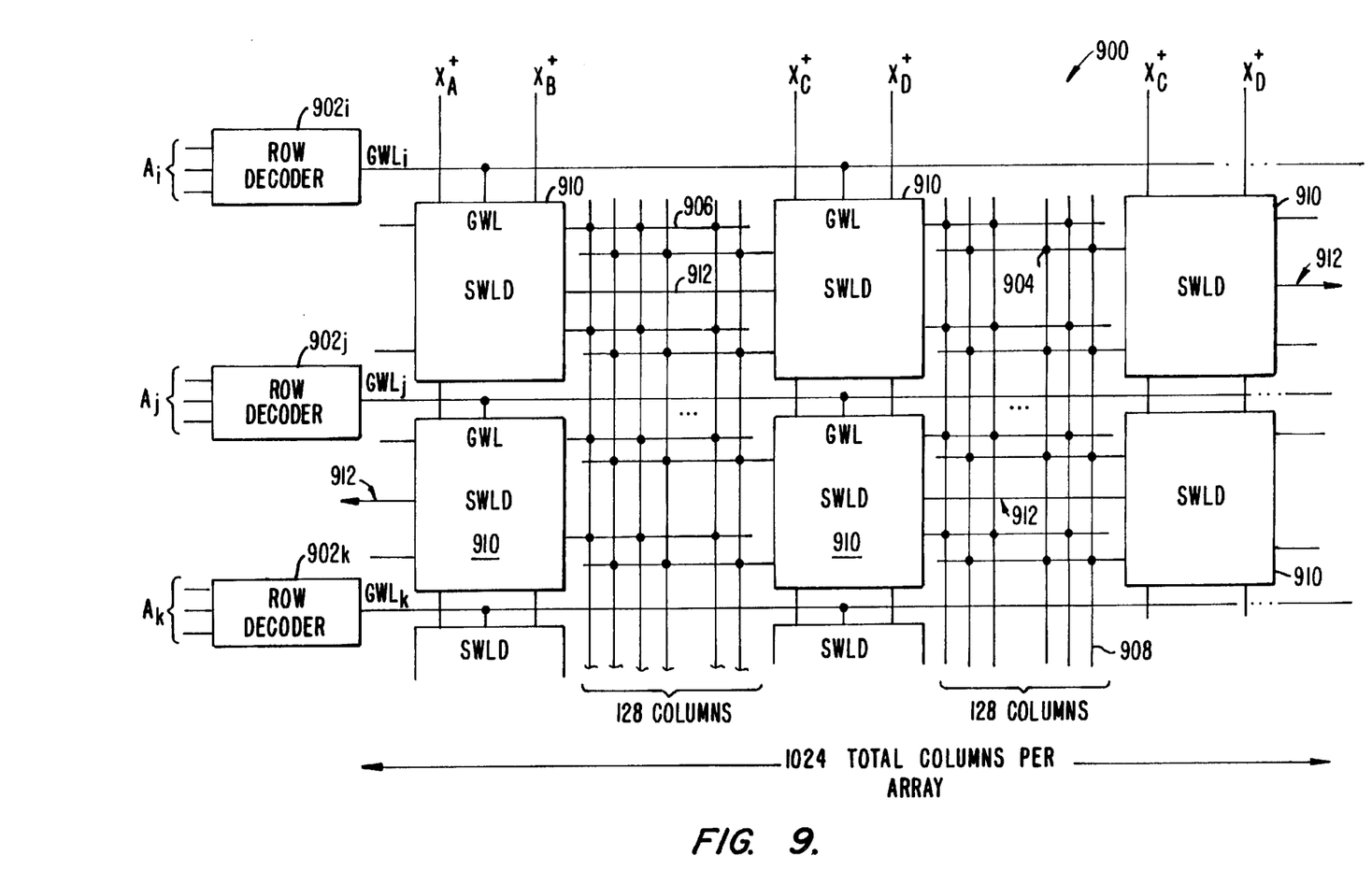
FIG. 9 illustrates a word line structure in which an shared inverting circuit is implemented in accordance with the present invention

FIG. 9 illustrates a word line structure 900 in which an inverting circuit is shared between two adjacent SWLDs. In much the same manner as shown in FIG. 2, $GWLs_{i,j,k}$ extend from row decoders $902_{i,j,k}$ and connect to SWLDs 910. Each SWLD 910 drives two polysilicon SWLs 906, although a larger number of SWLs may be driven in alternative embodiments. Memory cells 904 are located and accessed at the intersection of the SWLs 906 and bit lines or columns 908.

The word line structure 900 further includes interconnecting lines 912 for carrying the signal GWL# between two adjacently located SWLDs 910. Either of the adjacently connected SWLDs 910 incorporates one of the above-described inverting circuits and supplies the other SWLD with the inverted signal GWL# via the interconnect line 912. As can be appreciated, additional SWLDs may be driven by a single inverting circuit, in which case additional interconnecting lines are used between the supplied SWLDs.

Any of the various embodiments for an inverting circuit as described earlier, as well as other known inverting circuits may be incorporated within the SWLDs. The interconnecting line is preferably a metal line, the same type as that employed for the GWLs. As a consequence of the shared inverting circuit architecture shown in FIG. 9, the power consumed by the word line structure's inverting circuits is reduced by 50%. A further decrease in power consumption can be realized if a larger number of SWLDs are shared. In addition, this word line structure may occupy less layout area. If the area required for each inverting circuit is relatively large, for instance in the case when resistively-loaded inverting circuits are used, the shared inverting circuit architecture results in the spacing between the metal $GWLs_{i,j}$ and $GWLs_{j,k}$ being reduced due to the removal of one of the inverting circuits.

Figure 10:
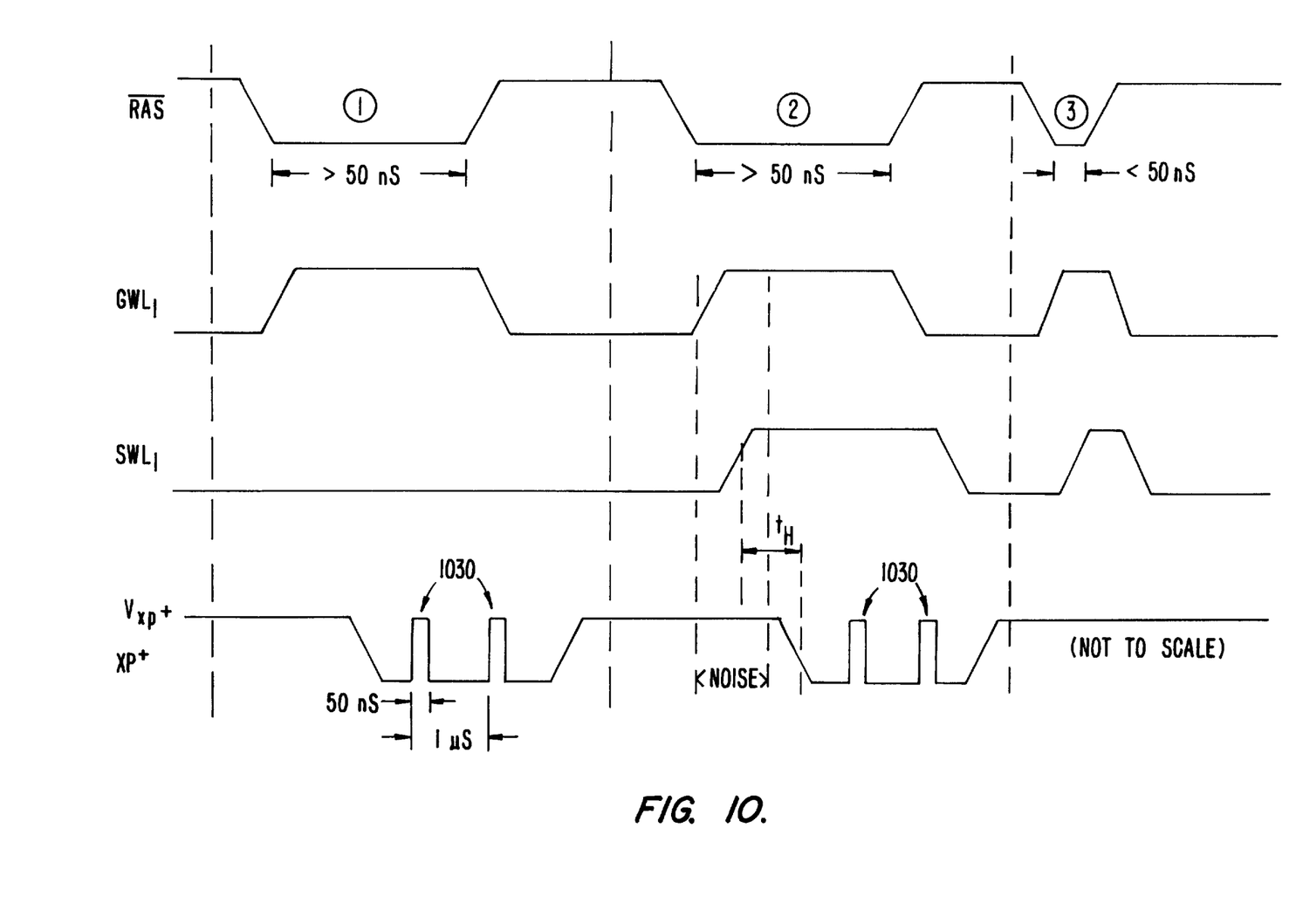
FIG. 10 is a timing diagram illustrating the operation of the exemplary embodiment of the sub-word line driver shown in FIG. 9 in accordance with the present invention.

FIG. 7, described above, illustrates a timing diagram of a $XP^+$ control signal used to control the clamping transistor 306 in SWLDs 210. In an alternative embodiment, FIG. 10 illustrates a pulsed $XP^+$ control signal in which periodic pulses occur during the low state. As will be explained below, the pulses operate to ensure that the unselected SWLs are clamped off in case of a long active cycle.

Referring to FIG. 10, during the first period of the RAS# timing diagram, the RAS# signal transitions from high-to-low states, indicating the start of an active period within the device. The selected GWL transitions high, but an unselected SWL remains low. After a delay, the pulsed $XP^+$ control signal transitions high-to-low indicating an active SWLD within the device.

Now referring to FIG. 6, within an unselected SWLDj the GWL is inactive and at a low state turning pull-down transistor 310 off. The $XP^+$ control signal remains high for a period of time, activating the pull-up transistor 312 and applying a high voltage to the gate terminal of the clamping transistor 306. The clamping transistor 306 is activated and securely clamps the unselected SWL to ground.

The $XP^+$ control signal subsequently transitions to a low state, deactivating the pull-up transistor 312. As a consequence, the pull-down and pull-up transistors 310 and 312 are switched off and the gate terminal of the clamping transistor 306 floats. If the SWL remains in an unselected state for an extended period of time, the gate voltage of transistor 306 may discharge, thereby releasing the unselected SWL from ground, and potentially causing an erroneous memory access.

The pulsed $XP^+$ control signal of FIG. 10 includes pulses 1030 which restore a high voltage state to the gate terminal of the clamping transistor 306 in case of an extended active cycle. During the pulsed periods, the pulsed $XP^+$ control signal applies a pulsed voltage $V_{XP+}$ to gate terminal of the pull-up transistor 312, rendering it conductive for the pulsed period(s). As a result, a pulsed voltage level (the lower of $V_{DD}$ or $V_{XP+}$-$V_T$) is applied to the gate terminal of the clamping transistor 306. The application of a pulsed voltage activates the gate terminal of the clamping transistor 306, thereby ensuring that the unselected SWL connected thereto remains firmly clamped to ground.

The second RAS# period of FIG. 10 illustrates the waveforms when the pulsed $XP^+$ control signal is supplied to an active SWLD. Initially, the RAS# signal transitions to a low level indicating an active state. Following a delay, the $GWL_i$ transitions to a high state, indicating an active state along the $GWL_i$ line. After a delay, which may but not necessarily include the aforementioned <noise> and $t_H$ periods shown in FIG. 7, the $SWL_i$ transitions to a high state indicating that the $SWLD_i$ has become active.

Within the active SWLD, the GWL is held high which activates the pull-down transistor 310. The positive pulses 1030 of the pulsed $XP^+$ control signal activates the pull-up transistor 312, resulting in current being drawn between the power supply and ground by inverter 308. Thus, in active SWLDs, the pulsed $XP^+$ control signal results in power consumption, the amount of which will be determined by the width and period of the pulses 1030. By minimizing the width of pulses 1030 and maximizing their period, the contribution of the inverter cross-bar current can be minimized. The pulsed $XP^+$ control signal thus achieves a balance between power consumption and maintaining a solid hold-off function of an unselected SWL.

In addition, the pulsed $XP^+$ control signal may also operate without pulses, for instance, when the RAS# signal period does not exceed a predetermined minimum period. This mode of operation is illustrated in the third RAS# period of FIG. 10. Here, the pulsed $XP^+$ control signal remains high since the RAS# signal period does not exceed a predetermined period of 50 nS. The pulses 1030 may be of any desired duration and amplitude, and repeated either aperiodically or periodically at any desired frequency. In the exemplary embodiment of FIG. 10, the pulsed $XP^+$ control signal is periodic every 1 uS, has a pulse width of 50 nS, and has a minimum period of 50 nS before pulse generation.

Figure 11A:
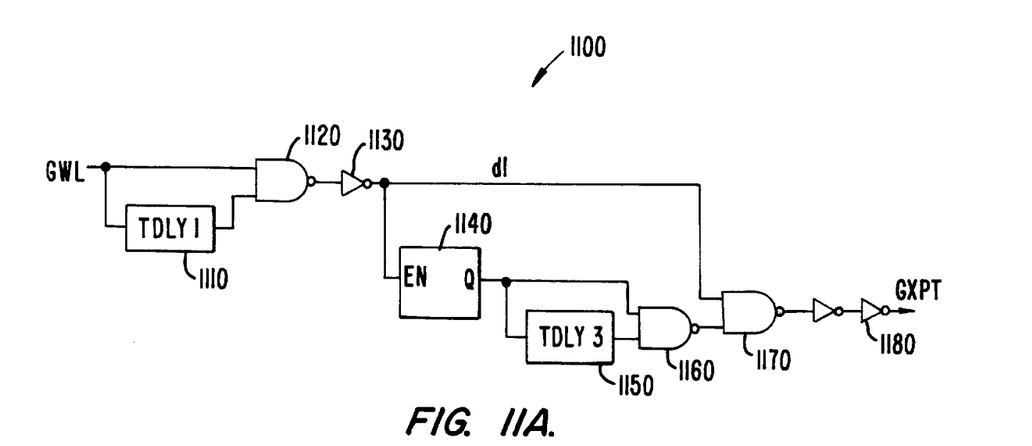
FIG. 11a illustrates an exemplary embodiment of the logic circuit for generating the pulsed XP$^+$ signal shown FIG. 10 in accordance with the present invention.

FIG. 11a illustrates a logic circuit 1100 for generating the pulsed $XP^+$ control signal, although other embodiments may also be used. In the illustrated embodiment, the logic circuit primarily consists of three one-shot circuits, the first consisting of a non-inverting timing delay 1110, NAND gate 1120, and inverter 1130, the second one-shot circuit consisting of an inverting timing delay 1150 and a NAND gate 1160, and the third one-shot circuit consisting of the second one shot circuit, a ring oscillator 1140, and a NAND circuit 1170. The first one-shot produces the minimum pulse width, described above as 50 nS. The second provides the amount of delay needed to produce the pulse duration of the pulses 1030, described above as 50 nS. The third one-shot produces the delay corresponding to the pulse period, described above as 1 uS. Those skilled in the art would appreciate that other logic circuits are possible to produce the described pulse generation circuit.

Figure 11B:
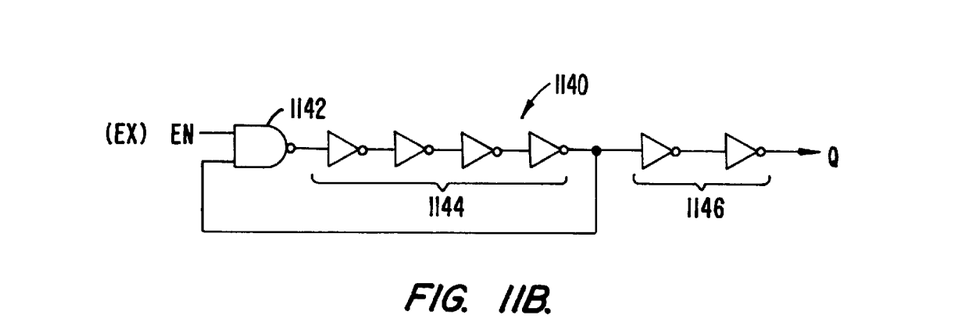
FIG. 11b illustrates one embodiment of the ring oscillator employed in the logic circuit of FIG. 11a in accordance with the present invention.

FIG. 11b illustrates one embodiment of the ring oscillator 1140 used in the third one-shot circuit. The ring oscillator 1440 is preferably designed to provide twice the amount of delay required for the pulse period. Additional inverter elements 1146 may be included as shown to provide further delay.

Figure 12:
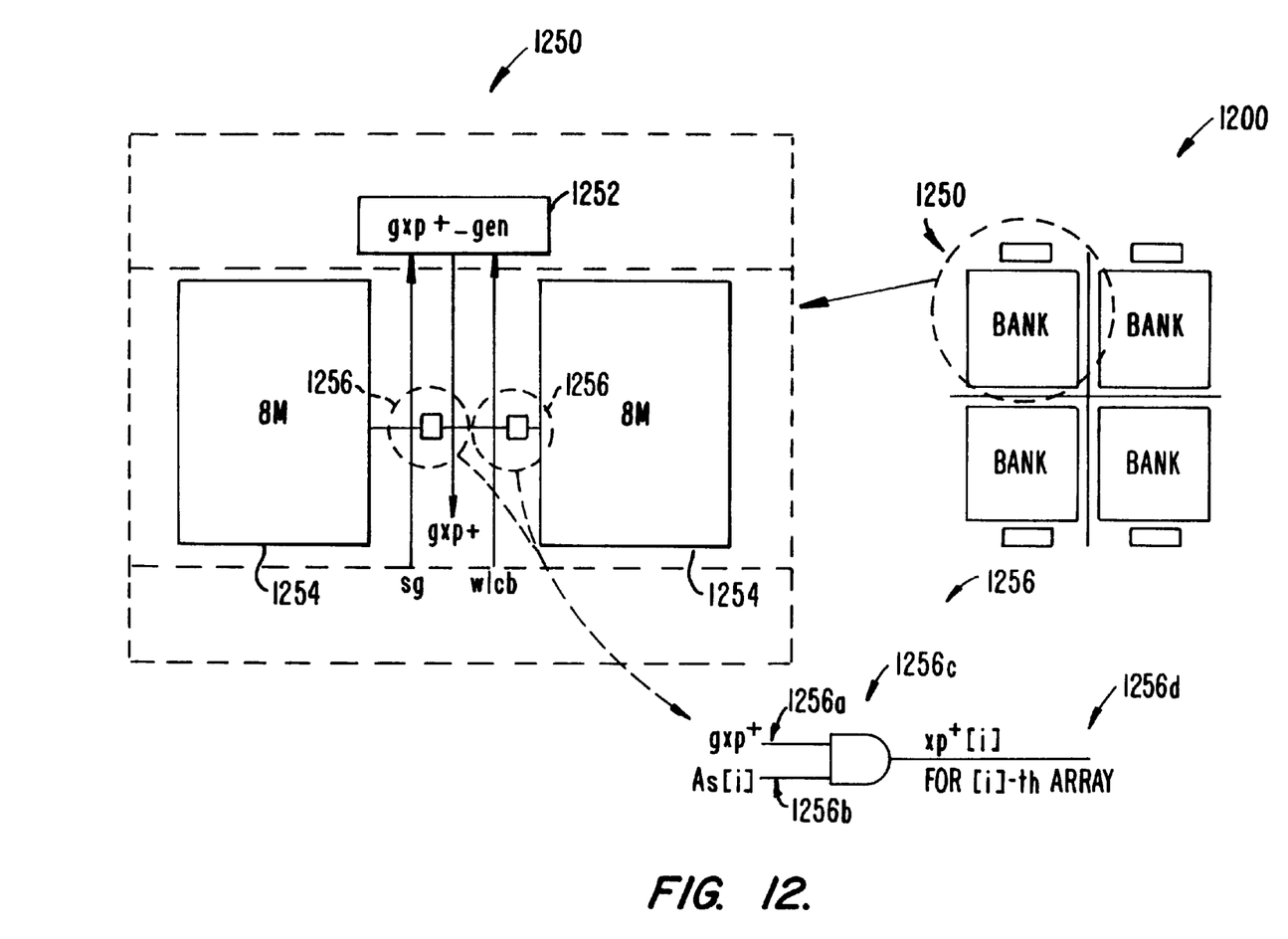
FIG. 12 illustrates an exemplary embodiment of a memory store in which the described pulsed XP$^+$ signal may be used in accordance with the present invention.

FIG. 12 illustrates an exemplary embodiment of a memory device 1200 consisting of several banks 1250 having multiple arrays 1254 to which the described pulsed XP⁺ control signal is supplied. Within each bank 1250, a pulsed XP⁺ control signal 1256a is generated from a XP⁺ logic circuit 1252 (described above) and distributed to multiple arrays 1254 therein. GXP⁺ distribution circuits 1256 are used to provide the XP⁺ control signal 1256a to the active memory array. Within the GXP⁺ distribution circuit 1256, the global pulsed XP⁺ control signal 1256a and an array select signal 1256b are supplied to an AND gate 1256c. The array select signal 1256b transitions to a high state when its corresponding array is active, and the AND gate 1256c outputs the XP⁺ control signal to the active memory array. While the exemplary embodiment of FIG. 12 shows (2) eight megabit DRAM memory arrays within each memory bank 1250, those of skill in the art would appreciate that the embodiment is not limited thereto and that a larger or smaller number of memory arrays and/or a larger or smaller number of memory banks may also be used to practice the present invention.

While the above is a complete description of the preferred embodiments of the present invention, it is possible to use various alternatives, modifications and equivalents. For example, the word line architecture of the present invention is described in the context of a DRAM circuit having an exemplary array size. However, applicability of the techniques of the present invention is not dependent on the memory size or the type of memory circuit. Also, the exemplary architecture used to illustrate the principles of the present invention shows a metal pitch that accommodates four polysilicon sub-word lines. However, similar techniques may be employed to interpose a greater number of sub-word lines between global word line to further relax the metal pitch requirement (or fewer sub-word lines if desired). A greater number of sub-word lines can be driven by each sub-word line driver by, for example, including more than two internal drivers in each sub-word line driver and supplying each sub-word line driver with more than two X⁺ signals. Further, alternative materials to metal and polysilicon may be used to route the global word lines and the sub-word lines. Therefore, the scope of the present invention should be determined not with reference to the above description but should, instead, be determined with reference to the appended claims, along with their full scope of equivalents.

What is claimed is:

1. A memory circuit comprising:
   an array of memory having a plurality of memory cells respectively located at intersections of a plurality of columns and a plurality of rows, each row being divided into a plurality of segments of sub-word lines;
   a row decoder having an input coupled to receive row address information and an output coupled to a global word line;
   a first sub-word line driver located along said global word line having an input coupled to said global word line and a sub-word line output, said first sub-word line driver further comprising an inverting circuit for inverting a signal propagating along said global word line;
   a second sub-word line driver located along said global word line having a first input coupled to said global word line, a second input for receiving said inverted signal from said first sub-word line driver, and a sub-word line output; and
   an interconnect line coupled between said first sub-word line driver and said second sub-word line driver for communicating said inverted signal therebetween.

2. The memory circuit of claim 1 wherein said inverting circuit comprises a pull-down transistor having a gate terminal coupled to said respective global word line and a source/drain terminal coupled to a pull-up device.

3. The memory circuit of claim 2 wherein said pull-up device comprises a resistor.

4. The memory circuit of claim 3 wherein said pull-up device comprises a pull-up transistor.

5. The memory circuit of claim 4 wherein said pull-up transistor comprises a gate terminal coupled to a control signal, and wherein said control signal switches said pull-up transistor ON and OFF according to a predefined timing.

6. The memory circuit of claim 5 wherein said pull-up transistor is ON during a first part of said predefined timing when said signal on said global word line and said signal on said sub-word line switch states, said pull-up transistor is ON during a second part of said predefined timing when said signal on said global word line is high for a period less than a predetermined minimum duration.

7. The memory circuit of claim 5 wherein said pull-up transistor is ON during a first part of said predefined timing when said signal on said global word line and said signal on said sub-word line switch states, said pull-up transistor is OFF during a second part of said predefined timing when said signal on said global word line and said signal on said sub-word line both reach a final value.

8. The memory circuit of claim 7 wherein said signal on said global word line operates at a high logic level during said second part of said predefined timing and said pull-up transistor is switched ON during a third part of said predefined timing.

9. The memory circuit of claim 8 wherein said pull-up transistor is switched OFF during a fourth part of said predefined timing.

10. The memory circuit of claim 9 wherein said third and fourth time periods are repeated.

11. The memory circuit of claim 9 wherein said third time period is 50 nS and said fourth time period is 1 uS.

12. The memory circuit of claim 5 further comprising a logic circuit for generating said control signal.

13. The memory circuit of claim 12 wherein said logic circuit comprises:
    a first one-shot circuit having an input coupled to said global word line and an output for providing a first pulse period;
    a second one-shot circuit having an input coupled to said output of said first one-shot circuit and an output for providing a second pulse period; and
    a third one-short circuit having a first input coupled to said output of said first one shot, a second input coupled to said input of said second one shot and an output for providing said control signal.

14. The memory circuit of claim 1 wherein said first sub-word line driver comprises:
    a first internal driver circuit having a first input coupled to said global word line, a second input coupled to an output of said inverting circuit, and a first sub-word line output; and
    a second internal driver circuit having a first input coupled to said global word line, a second input coupled to said output of said inverting circuit, and a second sub-word line output.

15. The memory circuit of claim 14 wherein said first internal driver circuit comprises:
    a first transistor having a first source/drain terminal coupled to said respective global word line, a second source/drain terminal coupled to a boost node, and a gate terminal;

a second transistor having a first source/drain terminal coupled to said first sub-word line output, a second source/drain terminal coupled to a select line, and a gate terminal coupled to said boost node; and a third transistor having a first source/drain terminal coupled to said first sub-word line output, a second source/drain terminal coupled to a reference level, and a gate terminal coupled to said output of inverting circuit.

16. The memory circuit of claim 15 wherein said global word line and said interconnect line comprise a metallic material and said at least two sub-word lines comprise a polysilicon material.

17. A memory circuit comprising:

an array of memory having a plurality of memory cells respectively located at intersections of a plurality of columns and a plurality of rows, each row being divided into a plurality of segments of sub-word lines;

a row decoder having inputs coupled to receive row address information and an output coupled to a global word line; and a plurality of sub-word line drivers respectively located at various intervals along each row, each sub-word line driver having an input coupled to a respective global word line and an output coupled to a respective sub-word line, wherein each of said sub-word line drivers comprises an inverting circuit for locally inverting a signal on said respective global word line, said inverting circuit comprising a pull-up transistor switched ON and OFF according to a control signal having a predefined timing, wherein said pull-up transistor is ON during a first part of said predefined timing when said signal on said global word line and said signal on said sub-word line switch states, said pull-up transistor is OFF during a second part of said predefined timing when said signal on said global word line reaches a final high logic level and said signal on said sub-word line reaches a final value, said pull-up transistor is switched ON during a third part of said predefined timing, and said pull-up transistor is switched OFF during a fourth part of said predefined timing.

18. The memory circuit of claim 17 wherein said third and fourth time periods are repeated.

19. The memory circuit of claim 18 wherein said third time period is 50 nS and said fourth time period is 1 uS.

20. A memory circuit comprising:

an array of memory having a plurality of memory cells respectively located at intersections of a plurality of columns and a plurality of rows, each row being divided into a plurality of segments of sub-word lines;

a row decoder having inputs coupled to receive row address information and an output coupled to a global word line;

a first plurality of sub-word line drivers located along each row, each of said first plurality of sub-word line drivers located in alternate positions along said row and having an input coupled to a respective global word line, an output coupled to a respective sub-word line, each of said first plurality of sub-word line drivers further comprising an inverting circuit for locally generating a signal propagating along said respective global word line;

a second plurality of sub-word line drivers located along each row, each sub-word line driver interposed between said first plurality of sub-word line drivers and having an input coupled to a respective global word line and an output coupled to a respective sub-word line, each of said second plurality of sub-word line drivers not including said inverting circuit;

an interconnect line coupled between adjacent sub-word line drivers for communicating said inverting signal.

* * * * *